(12) United States Patent
Sivanandan et al.

(10) Patent No.: US 12,195,635 B1
(45) Date of Patent: Jan. 14, 2025

(54) LIQUID DISPERSION OF QUANTUM DOT PARTICLES

(71) Applicant: Applied Materials, Inc., Santa Clara, CA (US)

(72) Inventors: Kulandaivelu Sivanandan, Fremont, CA (US); Sivapackia Ganapathiappan, Los Altos, CA (US); Nag Bhushanam Patibandla, Sunol, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/417,560

(22) Filed: Jan. 19, 2024

(51) Int. Cl.
| | | |
|---|---|---|
| *C09D 11/00* | (2014.01) | |
| *C09D 11/101* | (2014.01) | |
| *C09D 11/322* | (2014.01) | |
| *C09D 11/52* | (2014.01) | |
| *H10K 50/115* | (2023.01) | |

(52) U.S. Cl.
CPC ............ *C09D 11/52* (2013.01); *C09D 11/101* (2013.01); *C09D 11/322* (2013.01); *H10K 50/115* (2023.02)

(58) Field of Classification Search
CPC ............................. H10K 50/115; C09D 11/322
USPC ............................................ 106/31.01, 31.13
See application file for complete search history.

(56) References Cited

U.S. PATENT DOCUMENTS

| | | | |
|---|---|---|---|
| 10,852,584 B2 | 12/2020 | Cho et al. | |
| 11,094,530 B2 | 8/2021 | Zhang et al. | |
| 11,342,481 B2 | 5/2022 | Knisley et al. | |
| 2018/0326719 A1* | 11/2018 | Masuda | ............... B41J 2/01 |
| 2020/0248068 A1* | 8/2020 | Choi | ............... G02F 1/017 |
| 2020/0373279 A1 | 11/2020 | Ganapathiappan et al. | |
| 2021/0024820 A1 | 1/2021 | Choi et al. | |
| 2022/0029068 A1 | 1/2022 | Luo et al. | |
| 2022/0186112 A1 | 6/2022 | Liao et al. | |
| 2022/0190203 A1* | 6/2022 | Kim | ............... H01L 25/167 |
| 2022/0399479 A1 | 12/2022 | Xu et al. | |
| 2023/0006110 A1 | 1/2023 | Luo et al. | |
| 2023/0290909 A1 | 9/2023 | Li et al. | |
| 2023/0348778 A1 | 11/2023 | Sivanandan et al. | |

FOREIGN PATENT DOCUMENTS

| | | |
|---|---|---|
| KR | 20220106047 A | 7/2022 |
| WO | 2022163950 A1 | 8/2022 |
| WO | 2023054952 A1 | 4/2023 |

OTHER PUBLICATIONS

PCT International Search Report and Written Opinion in PCT/US2024/012181 dated Oct. 14, 2024, 10 pages.

* cited by examiner

*Primary Examiner* — James E McDonough
(74) *Attorney, Agent, or Firm* — Servilla Whitney LLC (57) ABSTRACT

Liquid dispersions of quantum dot particles include an acrylic medium having a boiling point in a range of from greater than or equal to 100° C. to less than or equal to 500° C., quantum dot particles dispersed in the acrylic medium, a photo-initiator, and a surface additive. The liquid dispersions of quantum dot particles are useful as stable liquid formulations that resist gelling for spin-coating and ink-jet printing of color conversion layers in the manufacture of LED and micro-LED panels for advanced displays. Methods of manufacturing light-emitting devices using the liquid dispersions of quantum dot particles are also disclosed.

14 Claims, 8 Drawing Sheets

LIQUID DISPERSION OF QUANTUM DOT PARTICLES

TECHNICAL FIELD

Embodiments of the disclosure generally relate to liquid dispersions of quantum dot particles used in the formation of color conversion layers in the manufacture of LED panels and micro-LED panels of display devices.

BACKGROUND

A light emitting diode (LED) panel uses an array of LEDs, with individual LEDs providing the individually controllable pixel elements. Such an LED panel can be used for a computer, touch panel device, personal digital assistant (PDA), cell phone, television monitor, and the like.

An LED panel that uses micron-scale LEDs based on III-V semiconductor technology (also called micro-LEDs) would have a variety of advantages as compared to organic LEDs (OLEDs), e.g., higher energy efficiency, brightness, and lifetime, as well as fewer material layers in the display stack which can simplify manufacturing. However, there are challenges in the fabrication of micro-LED panels. Micro-LEDs having different color emission (e.g., red, green, and blue pixels) need to be fabricated on different substrates through separate processes. Integration of the multiple colors of micro-LED devices onto a single panel typically requires a pick-and-place step to transfer the micro-LED devices from their original donor substrates to a destination substrate. This often involves modification of the LED structure or fabrication process, such as introducing sacrificial layers to ease die release. In addition, stringent requirements on placement accuracy can limit the throughput, the final yield, or both.

An alternative approach to bypass the pick-and-place step is to selectively deposit color conversion agents (CCAs) (e.g., quantum dots, nanostructures, photoluminescent materials, or organic substances) at specific pixel locations on a substrate fabricated with monochrome LEDs. The monochrome LEDs can generate relatively short wavelength light, e.g., purple or blue light, and the color conversion agents (CCAs) can convert this short wavelength light into longer wavelength light, e.g., red or green light for red or green pixels. The selective deposition of the color conversion agents (CCAs) can be performed using high-resolution shadow masks or controllable inkjet or aerosol jet printing. Print materials comprising liquid dispersions of quantum dot materials in an acrylic medium are used for spin-coating and inkjet and aerosol jet printing of the liquid dispersions.

Liquid dispersions of quantum dot particles in acrylic monomers are often not stable, particularly with respect to the viscosity of the liquid dispersions, which have a tendency to phase separate over time and increase in viscosity, forming gels. This problem is particularly difficult with blue and green quantum dot particles. Thus, liquid dispersions of quantum dot materials have short shelf lives, resulting in detrimental effects in the usage of these materials to form color conversion layers in display devices. In particular, providing a liquid dispersion that has both the initial and long term (stable) viscosity and surface tension for ink-jet printing, as well as the dispersion being curable with ultraviolet (UV) radiation that provide sub-pixels in display device that convert 385 nm radiation to red, blue and green light. Dispersion stability is a critical problem limiting the use of liquid dispersions of quantum dot particles, and it would be desirable to provide liquid dispersions of quantum dot particles exhibiting improved dispersion stability and longer shelf life.

SUMMARY

One or more embodiments of the disclosure are directed to a liquid dispersion of quantum dot particles comprising an acrylic medium having a boiling point in a range of from greater than or equal to 100° C. to less than or equal to 500° C. The quantum dot particles are dispersed in the acrylic medium. The liquid dispersion further comprises a photoinitiator and a surface additive.

Another embodiment pertains to a method of fabricating a light-emitting device. The method comprises depositing a photocurable liquid dispersion of quantum dot particles onto an array of LEDs or micro-LEDs that are integrated with backplane circuitry, wherein the photocurable liquid dispersion of quantum dot particles includes an acrylic medium having a boiling point in a range of from greater than or equal to 100° C. to less than or equal to 500° C., the quantum dot particles dispersed in the acrylic medium, a photo-initiator, and a surface additive; activating a plurality of the LEDs or the micro-LEDs from the array of the LEDS or the micro-LEDs to illuminate the photocurable liquid dispersion of quantum dot particles over the plurality of the LEDS or the micro-LEDs with light in a second wavelength band in the UV light range or the visible light range that causes the photo-initiator to initiate polymerization of the liquid dispersion of quantum dot particles and causes the quantum dot particles to emit light in a different first wavelength band in the visible light range; and removing an uncured portion of the photocurable liquid dispersion of quantum dot particles from the array of the LEDS or the micro-LEDs

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand way of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "some embodiments, "one or more embodiments," or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

As used in this specification and the appended claims, the term "substrate" refers to a surface, or portion of a surface, upon which color conversion layers in the manufacture of LED panels and micro-LED panels of display devices are deposited. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon. A "substrate" as used herein, refers to any substrate or material surface used during formation of color conversion layers in the manufacture of LED panels and micro-LED panels of display devices. For example, a substrate surface formation of can be performed include materials such as glass, sapphire, and any other materials such as metals, semiconductors and plastics.

The ambient stability of dispersions of quantum dot particles used in printing and spin-coating of color conversion layers in the manufacture of LED panels and micro-LED panels, and in particular, blue and green quantum dots is a problem, particularly, the viscosity stability that increases over time and with exposure to ambient conditions. Dispersions of quantum dot particles include an acrylic medium that are cured using in-situ curing processes during formation of the color conversion layers. Embodiments of the disclosure provide liquid dispersions of quantum dot particles that are stable over time and maintain their initial viscosity to prevent gelling of the liquid dispersions.

Quantum dot particles dispersed in an acrylic medium, (e.g., acrylate formulations) are provided that can be used in spin-coating and ink-jet printing. After UV curing of the liquid dispersion, the quantum dot particles are locked in a polyacrylate matrix and can be used as a color conversion layer for advanced displays.

According to one or more embodiments, the liquid dispersion of quantum dot particles is a photocurable composition in the form of an ink formulation. Embodiments of present disclosure advantageously provide photocurable compositions (liquid dispersions of quantum dot particles) that can be used as a color conversion layer in the manufacture of LED and micro-LED panels for advanced displays.

As described herein, the liquid dispersions of quantum dot particles for a micro-LED color conversion layer include a color conversion agent (CCA) (e.g., quantum dot particles) dispersed in an acrylic medium, a photo-initiator, and a surface additive. The liquid dispersion may optionally include one or more of a functional component (e.g., a high refraction index additive, an additional surface additive, a stray light absorber or UV blocker).

The color conversion agents (CCAs) are materials that emit visible radiation in a first visible wavelength band in response to absorption of UV radiation or visible radiation in a second visible wavelength band. The UV radiation typically has a wavelength in a range of 200 nm to 400 nm. The visible radiation typically has a wavelength or wavelength band in a range of 400 nm to 800 nm. The first visible wavelength band is different (e.g., more energetic) than the second visible wavelength band. That is, the color conversion agents (CCAs) are materials that can convert the shorter wavelength light from a micro-LED into longer wavelength light.

The color conversion agents (CCAs) include photoluminescent materials, such as organic or inorganic molecules, nanomaterials (e.g., nanoparticles, nanostructures, quantum dot particles), or other appropriate materials. Suitable nanomaterials typically include one or more III-V compounds. Examples of suitable III-V compounds include CdSe, CdS, InP, PbS, CuInP, ZnSeS, and GaAs. In some embodiments, the nanomaterials include one or more elements selected from the group consisting of cadmium, indium, copper, silver, gallium, germanium, arsenide, aluminum, boron, iodide, bromide, chloride, selenium, tellurium, and phosphorus. In some embodiments, the nanomaterials include one or more perovskites.

At least one of the color conversion agents (CCAs) includes photoluminescent quantum dot particles. Photoluminescent quantum dot particles typically include one or more III-V compounds. Examples of suitable III-V compounds include CdSe, CdS, InP, PbS, CuInP, ZnSe, ZnSeS, ZnSeTe and GaAs. The quantum dot particles can be homogeneous or can have a core-shell structure. The quantum dot particles can have an average diameter in a range of about 1 nm to about 10 nm.

At least one of the color conversion agents (CCAs) includes photoluminescent quantum dot particles. Photoluminescent quantum dot particles typically include one or more III-V compounds. Examples of suitable III-V compounds include CdSe, CdS, InP, PbS, CuInP, ZnSe, ZnSeS, ZnSeTe and GaAs. The quantum dot particles can be homogeneous or can have a core-shell structure. The quantum dot particles can have an average diameter, for example, in a range of from 1 nm to 10 nm. Commercially available quantum dot particles typically include quantum dot precursor materials (e.g., metal atoms and ions) along with the quantum dot particles.

Dispersion formulations that are in-situ cured in the formation of color conversion layers for advanced displays include an acrylic medium. Ambient stability of the dispersion formulations including liquid dispersions of quantum dot particles is important to ensure that the quantum dot particles do not settle in the print lines and in the printhead nozzles.

Some embodiments advantageously provide liquid dispersions of quantum dot particles that can be suspended in acrylic medium for greater than 16 hours, 24 hours, one day, one week, one month and up to six months either under inert atmosphere or ambient conditions without a substantial increase in viscosity that causes the formulation to gel. Advantageously, embodiments provide dispersion stability for spin-coating and ink-jetting applications that prevents settlement of the quantum dot particles along the delivery lines supplying the dispersion formulation connected to the printhead. Settling of the quantum dot particles and high viscosity has a detrimental effect on printing of the quantum dot formulations accurately. The liquid dispersions of quantum dot particle greatly reduce these issues and solve a long-standing problem of viscosity stability of quantum dot particle dispersions.

In addition, embodiments provided in this disclosure avoid clogging in the printhead due to the accumulation of particles that clog the printhead nozzle. Without intending to be bound by theory, green quantum dot particles is the worst among the red, green and blue quantum dot particles in terms of jetting stability. Quantum dot particles, and particularly, for example, green quantum dot particles, are highly sensitive to moisture, which can accelerate gelling and subsequently nozzle clogging Embodiments described herein improve the stability of dispersions of quantum dot particles, by selecting materials for red ink, blue ink, or green ink formulations whereby quantum dot particles are stably suspended without any gelation.

In one or more embodiments, the acrylic medium (in which the quantum dot particles are dispersed) has a boiling point in a range of from greater than or equal to 100° C. to less than or equal to 500° C. In some embodiments, the acrylic medium has a boiling point in the range of from greater than or equal to 100° C. to less than or equal to 500° C., including, for example, in the range of from greater than or equal to 110° C. to less than or equal to 500° C., in the range of from greater than or equal to 120° C. to less than or equal to 500° C., in the range of from greater than or equal to 130° C. to less than or equal to 500° C., in the range of from greater than or equal to 140° C. to less than or equal to 500° C., in the range of from greater than or equal to 150° C. to less than or equal to 500° C., in the range of from greater than or equal to 160° C. to less than or equal to 500° C., in the range of from greater than or equal to 170° C. to less than or equal to 500° C., in the range of from greater than or equal to 180° C. to less than or equal to 500° C., in the range of from greater than or equal to 190° C. to less than or equal to 500° C., in the range of from greater than or equal to 200° C. to less than or equal to 500° C., in the range of from greater than or equal to 250° C. to less than or equal to 500° C., in the range of from greater than or equal to 300° C. to less than or equal to 500° C., or in the range of from greater than or equal to 180° C. to less than or equal to 250° C.

The acrylic medium can include monomers, such as (meth) acrylate monomers, and can include one or more mono(meth) acrylates, di(meth) acrylates, tri (meth) acrylates, tetra(meth) acrylates, or a combination thereof. In some embodiments, the acrylic medium comprises one or more of an acrylate monomer, a diacrylate monomer, or an acrylamide monomer. The acrylic medium can be provided by a negative photoresist, e.g., SU-8 photoresist. Examples of suitable mono(meth) acrylates include isobornyl(meth) acrylates, cyclohexyl(meth) acrylates, trimethylcyclohexyl (meth) acrylates, diethyl(meth) acrylamides, dimethyl (meth) acrylamides, nonyl(meth) acrylate, octadecyl(meth) acrylate, and tetrahydrofurfuryl(meth) acrylates. The acrylic medium may include cross-linkers or other reactive compounds. Examples of suitable cross-linkers include polyethylene glycol di(meth) acrylates (e.g., diethylene glycol di(meth) acrylate or tripropylene glycol di(meth) acrylates), hexanediol di(meth) acrylate, neopentyl glycol di(meth) acrylate, N,N'-methylenebis-(meth) acrylamides, trimethylolpropane tri (meth) acrylate, pentaerythritol tri (meth) acrylates, and pentaerythritol tetra(meth) acrylates. Examples of suitable reactive compounds include polyethylene glycol (meth) acrylates, vinylpyrrolidone, vinylimidazole, (meth) acrylamides, alkyl(meth) acrylamides, dialkyl(meth) acrylamides), hydroxyethyl(meth) acrylates, morpholinoethyl acrylates, vinylformamides and 2-[[(Butylamino) carbonyl] oxy]ethyl acrylate (e.g., Photomer® 4184 available from IGM Resins).

In one or more specific embodiments, the acrylic medium is selected from the group consisting of 1,6-hexanediol diacrylate (HDDA), diethyl acrylamide (DEAA), isobornyl acrylate (IBOA), 1,4-butanediol diacrylate (BDA), nonanediol diacrylate (NDDA), trimethylolpropane triacrylate (TMPTA), tricyclodecane dimethanol diacrylate (TCDDDA), ethylene glycol diacrylate, hexyl acrylate, 2-ethylhexyl acrylate, octyl acrylate, 9-(acryloyloxy) nonyl acrylate, and mixtures thereof. In some embodiments, the acrylic medium is selected from the group consisting of 1,6-hexanediol diacrylate (HDDA), diethyl acrylamide (DEAA), isobornyl acrylate (IBOA), 1,4-butanediol diacrylate (BDA), nonanediol diacrylate (NDDA), trimethylolpropane triacrylate (TMPTA), and mixtures thereof. In specific embodiments, the acrylic medium comprises 1,6-hexanediol diacrylate (HDDA).

In one or more specific embodiments, the quantum dot particles are received in the acrylic medium. In one or more specific embodiments, the acrylic medium includes the quantum dot particles received in an acrylic monomer, for example, 1,6-hexanediol diacrylate (HDDA). In specific embodiments where the acrylic medium includes the quantum dot particles received in, for example, 1,6-hexanediol diacrylate (HDDA), the acrylic medium also includes additional acrylic monomers, e.g., one or more of an acrylate monomer, a diacrylate monomer, or an acrylamide monomer. In specific embodiments where the acrylic medium includes the quantum dot particles received in, for example, 1,6-hexanediol diacrylate (HDDA), and the acrylic medium also includes additional acrylic monomers, the additional monomers may be the same or different than the acrylic medium in which the quantum dot particles are received.

According to one or more embodiments, the liquid dispersion of quantum dot particles is a photocurable composition in the form of an ink formulation. In some embodiments, the liquid dispersion of quantum dot particles is a photocurable composition comprising one or more of a red ink formulation, a green ink formulation, or a blue ink formulation.

The photo-initiator initiates polymerization in response to radiation such as UV radiation, UV-LED radiation, visible radiation, and electron beam radiation. In some cases, the photo-initiator is responsive to UV or visible radiation. Suitable photo-initiators include free radical photo-initiators, such as bulk cure photo-initiators and surface cure photo-initiators.

Bulk cure photo-initiators cleave upon exposure to UV radiation, yielding a free radical, which may initiate polymerization. Bulk cure photo-initiators can be useful for both surface and through or bulk cure of the dispensed droplets. Bulk cure photo-initiators include benzoin ethers, benzyl ketals, acetyl phenones, alkyl phenones, phosphine oxides, benzophenone compounds, and thioxane compounds.

Surface cure photo-initiators are activated by UV radiation and form free radicals by hydrogen abstraction from a second compound, which becomes the actual initiating free radical. This second compound is often called a co-initiator or polymerization synergist, and may be an amine synergist. Amine synergists are used to diminish oxygen inhibition, and therefore, surface cure photo-initiators can be useful for fast surface cures. Surface cure photo-initiators include benzophenone compounds and thioxanthone compounds. An amine synergist is an amine with an active hydrogen. Amine synergists, such as amine-containing acrylates, may be combined with a benzophenone photo-initiator in a resin precursor composition formulation to a) limit oxygen inhibition, b) fast cure a droplet or layer surface so as to fix the dimensions of the droplet or layer surface, and c), increase layer stability through the curing process.

Examples of suitable photo-initiators include 1-hydroxycyclohexylphenyl ketone, 4-isopropylphenyl-2-hydroxy-2-methyl propan-1-one, 1-[4-(2-hydroxyethoxy)-phenyl]-2-hydroxy-2-methyl-1-propan-1-one, 2,2-dimethyl-2-hydroxy-acetophenone, 2,2-dimethoxy-2-phenylacetophenone, 2-hydroxy-2-methylpropionphenone, diphenyl(2,4,6-trimethylbenzoyl) phosphine oxide (TPO), ethyl(2,4,6-trimethylbenzoyl)phenylphosphinate (TPO-L), bis(2,6-dimethoxy-benzoyl)-2,4,6 trimethyl phenyl phosphine oxide, 2-methyl-1-1 [4-(methylthio)phenyl]-2-morpholino-propan-1-one, 3,6-bis(2-methyl-2-morpholino-propionyl)-9-n-octylcarbazole, 2-benzyl-2-benzophenone, 2,4,6-(dimethylamino)-1-(4-morpholinyl)phenyl)-1-butanone, trimethylbenzophenone, isopropyl thioxanthone, phenylbis (2,4,6-trimethylbenzoyl) phosphine oxide, 2-hydroxy-2-methyl-1 phenyl-1-propanone.

Suitable blends of photo-initiators commercially available include, but are not limited to, Darocur 4265, Irgacure 184, Irgacure 250, Irgacure 270, Irgacure 295, Irgacure 369, Irgacure 379, Irgacure 500, Irgacure 651, Irgacure 754, Irgacure 784, Irgacure 819, Irgacure 907, Irgacure 1173, Irgacure 2100, Irgacure 2022, Irgacure 4265, Irgacure TPO, Irgacure TPO-L, Esacure KT37, Esacure KT55, and Esacure KT0046 (available from BASF), and also Omnicat 250, and Omnicat 550 (available from IGM Resins). Suitable amine synergists include secondary and tertiary amine compounds with or without acrylic groups, such as diethanolamine, triethanolamine, and Genomer 5142.

In some embodiments, the photocurable liquid dispersions of quantum dot particles further includes a dispersant or surface additive that may be used to adjust the surface tension of the photocurable composition. Examples of suitable dispersants or surface additive include siloxane and polyethylene glycol. In specific embodiments, the surface additive comprises a silicone-containing surface additive, for example, a polyether-modified polydimethylsiloxane (e.g., one or more of BYK-306, BYK-307, BYK-310, BYK-320, BYK-333 and BYK-376, available from BYK-Chemie GmbH). In some embodiments, the surface additive comprises a surface additive that does not include silicone, such as a sorbitan alkyl ester or a sorbitan alkylene ester, for example, a sorbitan laurate (e.g., Span® 20), a sorbitan stearate (e.g., Span® 65) and a sorbitan oleate (e.g., Span @ 85), a polyethylene glycol sorbitan monostearate (e.g., TWEEN® 60) and a polyoxyethylenesorbitan trioleate (e.g., TWEEN® 85) (available from Croda International PLC).

Embodiments of the present disclosure advantageously provide photocurable liquid dispersions of quantum dot particles in the form of an ink formulation, e.g., one or more of a red ink formulation, a green ink formulation, or a blue ink formulation. In specific embodiments, the ink formulations can be used to form color conversion layers and include particular weight % ranges of the quantum dot particles, the acrylic medium, the quantum dot particles dispersed in the acrylic medium, the photo-initiator, and the surface additive.

The liquid dispersion of quantum dot particles according to one or more embodiments comprises in a range of from 5 weight % to 50 weight %, in a range of from 5 weight % to 40 weight %, in a range of from 5 weight % to 35 weight %, or in a range of from 5 weight % to 30 weight % quantum dot particles.

In specific embodiments, the red ink formulation comprises in a range of from 42 weight % to 73 weight % red quantum dot particles in HDDA, in a range of from 24 weight % to 54 weight % DEAA, in a range of from 2 weight % to 5 weight % photo-initiator, and in a range of from 0 weight % to 0.50 weight % of a polyether-modified polydimethylsiloxane (e.g., BYK-307, available from BYK-Chemie GmbH). In specific embodiments, the red ink formulation comprises in a range of from 15 to 25 weight % red quantum dot particles (e.g., inorganic weight %) in the red ink formulation. Accordingly, in embodiments where the red ink formulation comprises in the range of from 15 inorganic weight % to 25 inorganic weight % red quantum dot particles, the remainder of the range of from 50 weight % to 60 weight % red quantum dot particles in HDDA comprises HDDA, e.g., in a range of from 25 weight % to 45 weight %.

In one or more specific embodiments, the green ink formulation comprises in a range of from 57 weight % to 94 weight % green quantum dot particles in HDDA, in a range of from 2 weight % to 40 weight % DEAA, in a range of from 2 weight % to 5 weight % photo-initiator, and in a range of from 0 weight % to 0.50 weight % of a polyether-modified polydimethylsiloxane (e.g., BYK-307, available from BYK-Chemie GmbH). In one or more specific embodiments, the green ink formulation comprises in a range of from 57 weight % to 94 weight % green quantum dot particles in HDDA, in a range of from 2 weight % to 40 weight % HDDA, in a range of from 2 weight % to 5 weight % photo-initiator, and in a range of from 0 weight % to 0.50 weight % of a polyether-modified polydimethylsiloxane (e.g., BYK-307, available from BYK-Chemie GmbH).

In specific embodiments, the green ink formulation comprises in a range of from 20 weight % to 33 weight % green quantum dot particles (e.g., inorganic weight %) in the green ink formulation. Accordingly, in embodiments where the green ink formulation comprises in the range of from 20 inorganic weight % to 33 inorganic weight % green quantum dot particles, the remainder of the range of from 65 weight % to 80 weight % green quantum dot particles in HDDA comprises HDDA, e.g., in a range of from 22 weight % to 60 weight %.

In specific embodiments, the blue ink formulation comprises in a range of from 50 weight % to 98 weight % blue quantum dot particles in HDDA, in a range of from 2 weight % to 5 weight % photo-initiator, and in a range of from 0 weight % to 0.50 weight % of a polyether-modified polydimethylsiloxane (e.g., BYK-307, available from BYK-Chemie GmbH). In specific embodiments, the blue ink formulation comprises in a range of from 20 weight % to 40 weight % blue quantum dot particles (e.g., inorganic weight %) in the blue ink formulation. Accordingly, in embodiments where the blue ink formulation comprises in the range of from 20 inorganic weight % to 40 inorganic weight % blue quantum dot particles, the remainder of the range of from 85 weight % to 98 weight % blue quantum dot particles in HDDA comprises HDDA, e.g., in a range of from 45 weight % to 78 weight %.

According to one or more embodiments, the liquid dispersion of quantum dot particles is a photocurable composition in the form of an ink formulation, e.g., one or more of the red ink formulation, the green ink formulation, or the blue ink formulation, and has surface tension in a range of from 15 to 35 dynes per centimeter (dyne/cm), for example, in a range of from 20 to 25 dyne/cm.

In one or more embodiments, the viscosity of the liquid dispersion of quantum dot particles is in a range of from 5 to 200 centipoise (cP) at room temperature, e.g., a temperature in a range of from 20° C. to 25° C., measured using a Brookfield Cone and Plate Viscometer Model R/S Plus. In some embodiments, the viscosity of the liquid dispersion of quantum dot particles is in a range of 5 to 30 centipoise (cP). In accordance with one or more embodiments, the viscosity of the liquid dispersion of quantum dot particles is stable for greater than 16 hours, 24 hours, one day, one week, one month and up to six months without a substantial increase in viscosity that causes the formulation to gel. According to one or more embodiments, herein "stable" and "without a substantial increase in viscosity" refers to the dispersion exhibits a changed viscosity that does not increase more than two times the initial viscosity.

As used in this disclosure, "initial viscosity" refers to the viscosity measured at room temperature, e.g., a temperature in a range of from 20° C. to 25° C., using a Brookfield Cone and Plate Viscometer Model R/S Plus of a liquid dispersion of quantum dot particles immediately after (e.g., within 5 minutes) exposure of the liquid dispersion to ambient air. In some embodiments the changed viscosity is less than three times, less than four times, less than five times, less than ten times, less than twenty times, less than thirty times, less than forty times or less than 50 times the initial viscosity after exposure to ambient air.

The liquid dispersions of quantum dot particles according to one or more embodiments may optionally include one or more of a functional component (e.g., a high refraction index additive, an additional surface additive, a stray light absorber or UV blocker).

Optionally, the photocurable composition can include a solvent. The solvent can be organic or inorganic. Examples of suitable solvents include ethanol, toluene, dimethylformamide, methylethylketone, or a combination thereof. The solvent can be selected to provide a desired surface tension or viscosity for the photocurable composition. The solvent can also improve chemical stability of the other components.

Optionally, the photocurable composition can include a stray light absorber or a UV blocker. Examples of suitable straylight absorbers include Disperse Yellow 3, Disperse Yellow 7, Disperse Orange 13, Disperse Orange 3, Disperse Orange 25, Disperse Black 9, Disperse Red 1 acrylate, Disperse Red 1 methacrylate, Disperse Red 19, Disperse Red 1, Disperse Red 13, and Disperse Blue 1. Examples of suitable UV blockers include benzotriazolyl hydroxyphenyl compounds.

Optionally, the first photocurable composition can include one or more other functional ingredients. As one example, the functional ingredients can affect the optical properties of the color conversion layer. For example, the functional ingredients can include nanoparticles with a sufficiently high index of refraction (e.g., at least about 1.7) that the color conversion layer functions as an optical layer that adjusts the optical path of the output light, e.g., provides a microlens. Examples of suitable nanoparticles include $TiO_2$, $ZnO_2$, $ZrO_2$, $CeO_2$, $Al_2O_3$, $ZnO_2$, $SiO_2$ or a mixture of two or more of these oxides. Alternatively or in addition, the nanoparticles can have an index of refraction selected such that the color conversion layer functions as an optical layer that reduces total reflection loss, thereby improving light extraction. As another example, the functional ingredients can include a dispersant or additional surface additive to adjust the surface tension of the photocurable composition. Examples of suitable dispersants or surface additives include siloxane and polyethylene glycol. In specific embodiments, the surface additive comprises a silicone-containing surface additive, for example, a polyether-modified polydimethylsiloxane (e.g., BYK-307, available from BYK-Chemie GmbH). In some embodiments, the functional ingredients can include a photoluminescent pigment or phosphors including nanophosphors that emits visible radiation. Examples of suitable photoluminescent pigments include zinc sulfide and strontium aluminate.

The photocurable composition can be applied in one or more layers, and a thickness of the cured photocurable composition is typically in a range of from 10 nm to 100 microns, such as, for example, in a range of from 10 nm to 20 microns, in a range of from 10 nm to 1000 nm, or in a range of from 10 nm to 100 nm.

The photocurable compositions described herein may be implemented as color conversion layers in displays, such as micro-LED displays described with respect to FIGS. 1-5. While FIGS. 1-5 illustrate micro-LEDs, the liquid dispersion of quantum dot materials can be used in the manufacture of LEDs. The cured composition typically includes a color conversion agent comprising quantum dots, a photopolymer, and components of a photo-initiator that initiates photopolymerization of the photopolymer in response to absorption of radiation.

Figure 1:
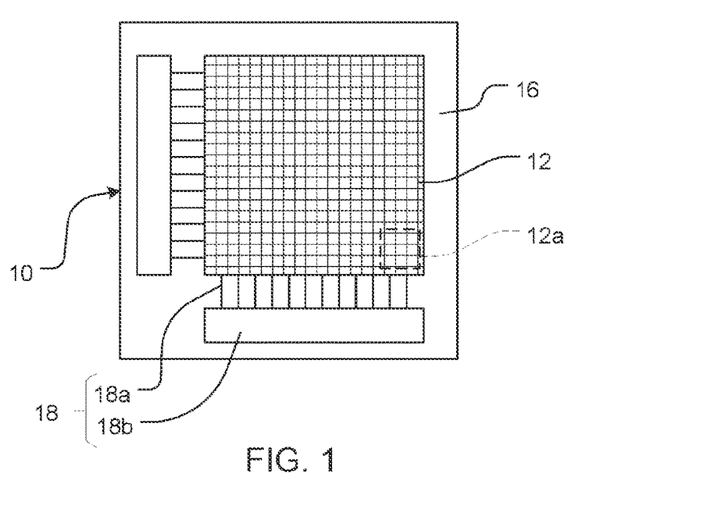
FIG. 1 is a schematic top view of a micro-LED array that has already been integrated with a backplane in accordance with one or more embodiments.

FIG. 1 illustrates a micro-LED display 10 that includes an array 12 of individual micro-LEDs 14 (see FIGS. 2A and 2B) disposed on a backplane 16. The micro-LEDs 14 are already integrated with backplane circuitry 18 so that each micro-LED 14 can be individually addressed. For example, the backplane circuitry 18 can include a TFT active matrix array with a thin-film transistor and a storage capacitor (not illustrated) for each micro-LED, column address and row address lines 18a, column and row drivers 18b, etc., to drive the micro-LEDs 14. Alternatively, the micro-LEDs 14 can be driven by a passive matrix in the backplane circuitry 18. The backplane 16 can be fabricated using conventional CMOS processes.

Figure 2A:
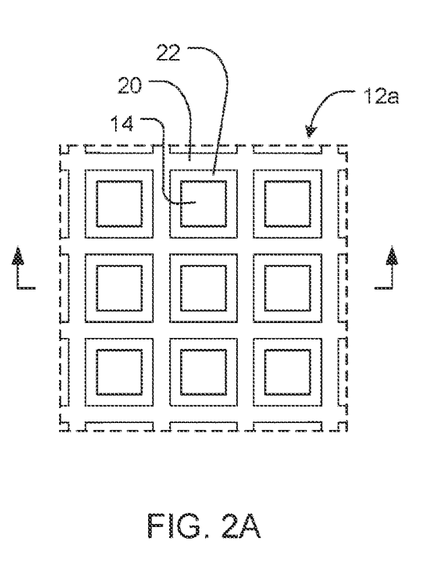
FIG. 2A is a schematic top view of a portion of the micro-LED array from FIG. 1.
Figure 2B:
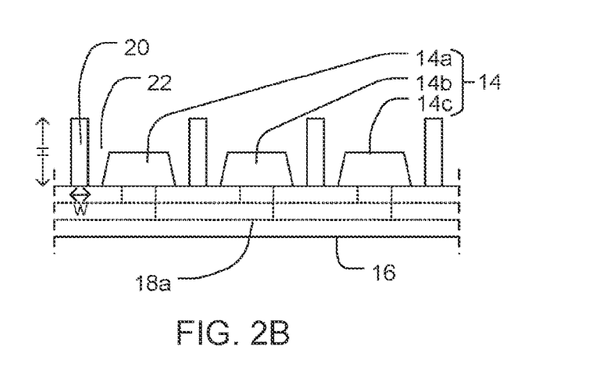
FIG. 2B is a schematic cross-sectional view of the portion of the micro-LED array from FIG. 2A.

FIGS. 2A and 2B illustrate a portion 12a of the array 12 of the individual micro-LEDs 14. All of the micro-LEDs 14 are fabricated with the same structure so as to generate the same wavelength range (this can be termed "monochrome"

micro-LEDs). For example, the micro-LEDs 14 can generate light in the ultraviolet (UV), e.g., the near ultraviolet range. For example, the micro-LEDs 14 can generate light in a range of 365 to 405 nm. As another example, the micro-LEDs 14 can generate light in the violet or blue range. The micro-LEDs 14 can generate light having a spectral bandwidth of 20 to 60 nm.

FIG. 2B illustrates a portion of the array 12 that can provide a single pixel. Assuming the micro-LED display is a three-color display, each pixel includes three sub-pixels, one for each color, e.g., one each for the blue, green, and red color channels. As such, the pixel can include three micro-LEDs 14a, 14b, 14c. For example, the first micro-LED 14a can correspond to a blue subpixel, the second micro-LED 14b can correspond to a green subpixel, and the third micro-LED 14c can correspond to a red subpixel. However, the techniques discussed below are applicable to micro-LED displays that use a larger number of colors, e.g., four or more colors. In this case, each pixel can include four or more micro-LEDs, with each micro-LED corresponding to a respective color. In addition, the techniques discussed below are applicable to micro-LED displays that use just two colors.

In general, the monochrome micro-LEDs 14 can generate light in a wavelength range having a peak with a wavelength no greater than the wavelength of the highest-frequency color intended for the display, e.g., purple or blue light. The color conversion agents (CCAs) can convert this short wavelength light into longer wavelength light, e.g., red or green light for red or green subpixels. If the micro-LEDs 14 generate UV light, then color conversion agents (CCAs) can be used to convert the UV light into blue light for the blue subpixels.

Vertical isolation walls 20 are formed between neighboring micro-LEDs. The vertical isolation walls 20 provide for optical isolation to help localize polymerization and reduce optical crosstalk during the in-situ polymerization discussed below. The vertical isolation walls 20 can be a photoresist or metal, and can be deposited by conventional lithography processes. As shown in FIG. 2A, the vertical isolation walls 20 can form a rectangular array, with each micro-LED 14 in an individual recess 22 defined by the vertical isolation walls 20. Other array geometries, e.g., hexagonal or offset rectangular arrays, are also possible. Possible processes for back-plane integration and isolation wall formation are discussed in more detail below.

The vertical isolation walls 20 can have any suitable height and width. In some embodiments, each of the vertical isolation walls 20 independently have a height H in a range of from 3 to 20 microns. In some embodiments, each of the vertical isolation walls 20 independently have a width W in a range of from 2 to 10 microns. The height H can be greater than the width W, e.g., the walls can have an aspect ratio of 1.5:1 to 5:1. The height H of the vertical isolation walls 20 is sufficient to block light from one micro-LED from reaching an adjacent micro-LED.

A photocurable composition (e.g., first photocurable composition, second photocurable composition, a third photocurable composition, etc.) includes a polymerizable component, a photo-initiator to trigger polymerization under illumination of a wavelength corresponding to the emission of the micro-LEDs 14, and color conversion agents (CCAs). The polymerizable component includes a reactive component and an anti-oxygen inhibition additive as described herein.

After curing of the photocurable composition, components of the photo-initiator may be present in the cured photocurable composition (the photopolymer), where the components are fragments of the photo-initiator formed during breaking of bonds in the photo-initiator in the photo-initiation process.

Figure 3A:
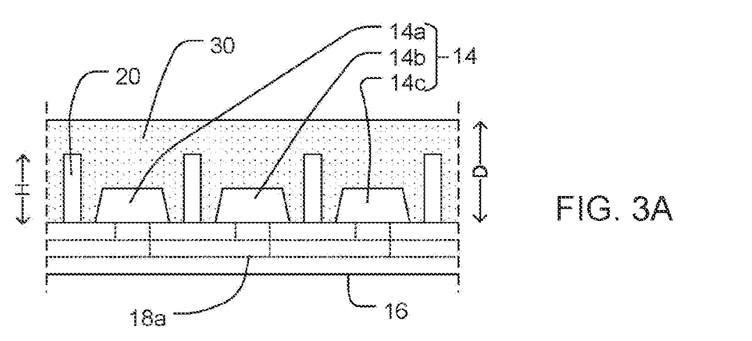
FIGS. 3A-3H illustrate a method of selectively forming color conversion layers over a micro-LED array in accordance with one or more embodiments.

Referring to FIG. 3A, the first photocurable composition can be deposited on the display over the micro-LED array by a spin-on, dipping, spray-on, or ink-jet process. An ink-jet process can be more efficient in consumption of the first photocurable composition.

Figure 3B:
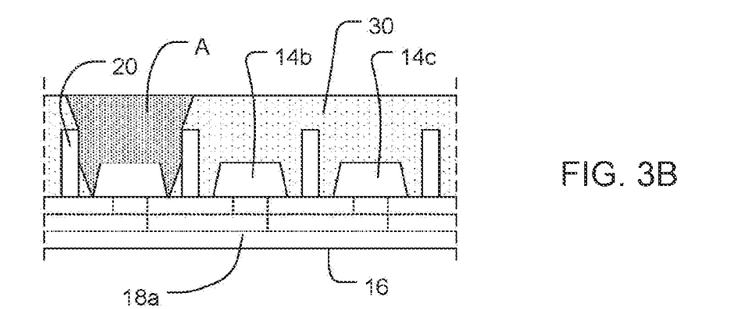

Next, as shown in FIG. 3B, the circuitry of the backplane 16 is used to selectively activate a first plurality of micro-LEDs 14a. This first plurality of micro-LEDs 14a correspond to the sub-pixels of a first color. In particular, the first plurality of micro-LEDs 14a correspond to the sub-pixels for the color of light to be generated by the color conversion agents (CCAs) in the photocurable composition. For example, assuming the color conversion agents (CCAs) in the first photocurable composition will convert light from the micro-LED 14 into blue light, then only those micro-LEDs 14a that correspond to blue sub-pixels are turned on. Because the micro-LED array is already integrated with the backplane circuitry 18, power can be supplied to the micro-LED display 10 and control signals can be applied by a microprocessor to selectively turn on the micro-LEDs 14a.

Figure 3C:
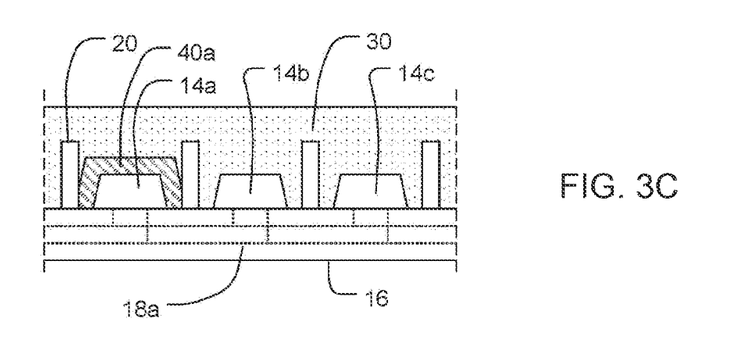

Referring to FIGS. 3B and 3C, activation of the first plurality of micro-LEDs 14a generates illumination A (see FIG. 3B) which causes in-situ curing of the first photocurable composition to form a first solidified color conversion layer 40a (see FIG. 3C) over each activated micro-LED 14a. In one or more embodiments, the first photocurable composition is cured to form color conversion layers 40a, but only on the selected micro-LEDs 14a. For example, a color conversion layer 40a for converting to blue light can be formed on each micro-LED 14a.

In some implementations, the illumination from the selected micro-LEDs 14a does not reach the other micro-LEDs 14b, 14c. In this circumstance, the vertical isolation walls 20 may not be necessary. However, if the spacing between the micro-LEDs 14 is sufficiently small, vertical isolation walls 20 can affirmatively block illumination A from the selected micro-LED 14a from reaching the area over the other micro-LEDs that would be within the penetration depth of the illumination from those other micro-LEDs. Vertical isolation walls 20 can also be included to prevent illumination reaching the area over the other micro-LEDs.

The driving current and drive time for the first plurality of micro-LEDs 14a can be selected for appropriate photon dosage for the photocurable composition. The power per subpixel for curing the first photocurable composition is not necessarily the same as the power per subpixel in a display mode of the micro-LED display 10. For example, the power per subpixel for the curing mode can be higher than the power per subpixel for the display mode.

Figure 3D:
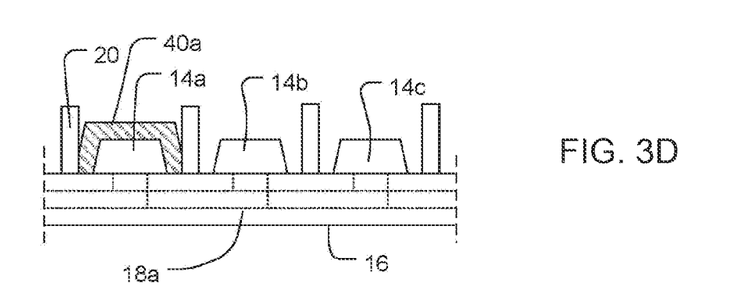

Referring to FIG. 3D, when curing is complete and the first solidified color conversion layer 40a is formed, the residual uncured first photocurable composition is removed from the micro-LED display 10. This leaves the other micro-LEDs 14b, 14c, exposed for the next deposition steps. In some embodiments, the uncured first photocurable composition is simply rinsed from the display with a solvent, e.g., ethanol, isopropanol, toluene, propylene glycol monomethyl ether acetate, dimethylformamide, or methylethylketone, or a combination thereof. If the photocurable composition includes a negative photoresist, then the rinsing fluid can include a photoresist developer for the photoresist.

Figure 3E:
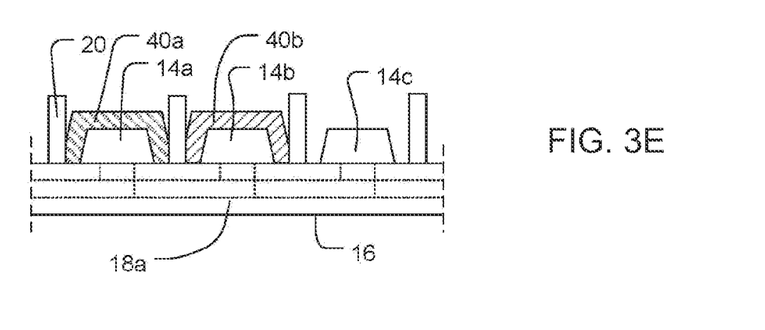

Referring to FIG. 3E, the treatment described above with respect to FIGS. 3A-3D is repeated, but with a second photocurable composition and activation of a second plurality of micro-LEDs 14*b*. After rinsing, a second color conversion layer 40*b* is formed over each of the second plurality of micro-LEDs 14*b*.

The second photocurable composition may be similar to the first photocurable composition but includes color conversion agents (CCAs) to convert the shorter wavelength light from the micro-LEDs 14 into longer wavelength light of a different second color. The second color can be, for example, green.

The second plurality of micro-LEDs 14*b* correspond to the sub-pixels of a second color. In particular, the second plurality of micro-LEDs 14*b* correspond to the sub-pixels for the color of light to be generated by the color conversion agents (CCAs) in the second photocurable composition. For example, assuming the color conversion agents (CCAs) in the second color conversion layer 40*b* will convert light from the micro-LED 14 into green light, then only those micro-LEDs 14*b* that correspond to green sub-pixels are turned on.

Figure 3F:
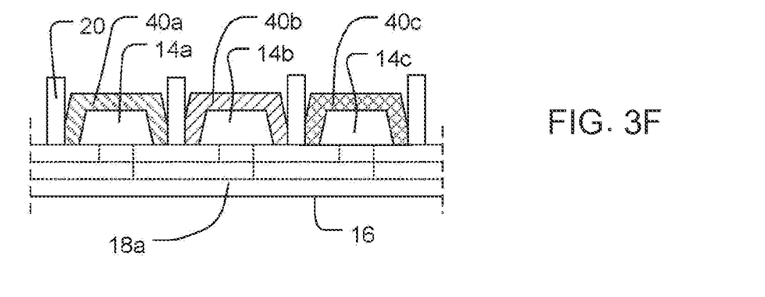

Referring to FIG. 3F, the treatment described above with respect to FIGS. 3A-3D is optionally repeated again, but with a third photocurable composition and activation of a third plurality of micro-LEDs 14*c*. After rinsing, a third color conversion layer 40*c* is formed over each of the third plurality of micro-LEDs 14*c*.

The third photocurable composition may be similar to the first photocurable composition, but includes color conversion agents (CCAs) to convert the shorter wavelength light from the micro-LEDs 14 into longer wavelength light of a different third color. The third color can be, for example, red.

The third plurality of micro-LEDs 14*c* correspond to the sub-pixels of a third color. In particular, the third plurality of micro-LEDs 14*c* correspond to the sub-pixels for the color of light to be generated by the color conversion agents (CCAs) in the third photocurable composition. For example, assuming the color conversion agents (CCAs) in the fluid will convert light from the micro-LED 14 into red light, then only those micro-LEDs 14*c* that correspond to red sub-pixels are turned on.

In the specific embodiments illustrated in FIGS. 3A-3F, color conversion layers 40*a*, 40*b*, 40*c* are deposited for each color sub-pixel. This is needed, e.g., when the micro-LEDs 14 generate ultraviolet light.

However, the micro-LEDs 14 could generate blue light instead of UV light. In this case, the coating of the micro-LED display 10 by a photocurable composition containing blue color conversion agents (CCAs) can be skipped, and the process can be performed using the photocurable compositions for the green and red subpixels. One plurality of micro-LEDs is left without a color conversion layer, e.g., as shown in FIG. 3E. In specific embodiments where one plurality of micro-LEDs is left without a color conversion layer (see FIG. 3E), the process shown by FIG. 3F is not performed. For example, the first photocurable composition could include green color conversion agents (CCAs) and the first plurality of micro-LEDs 14*a* could correspond to the green subpixels, and the second photocurable composition could include red color conversion agents (CCAs) and the second plurality of micro-LEDs 14*b* could correspond to the red subpixels.

Figure 3G:
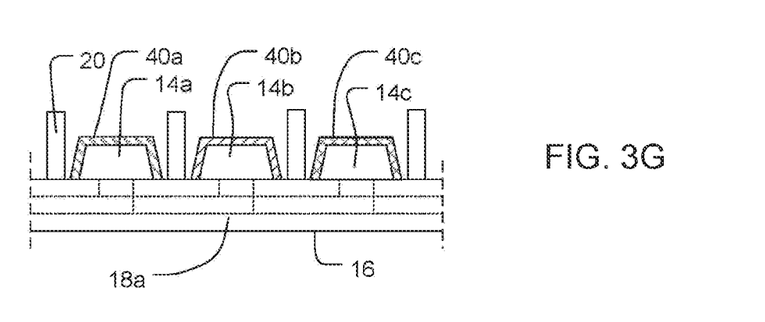

Assuming that the photocurable compositions included a solvent, some solvent may be trapped in the color conversion layers 40*a*, 40*b*, 40*c*. Referring to FIG. 3G, this solvent can be evaporated, e.g., by exposing the micro-LED array to heat, such as by IR lamps. Evaporation of the solvent from the color conversion layers 40*a*, 40*b*, 40*c* can result in shrinking of the layers so that the final layers are thinner.

Removal of the solvent and shrinking of the color conversion layers 40*a*, 40*b*, 40*c* can increase concentration of color conversion agents (CCAs), e.g., quantum dot particles, thus providing higher color conversion efficiency. On the other hand, including a solvent permits more flexibility in the chemical formulation of the other components of the photocurable compositions, e.g., in the color conversion agents (CCAs) or cross-linkable components.

Figure 3H:
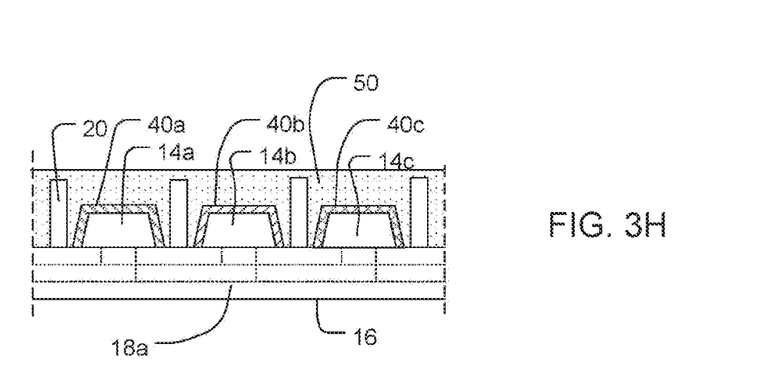

Optionally, as shown in FIG. 3H, a UV blocking layer 50 can be deposited on top of one or more of the micro-LEDs 14. The UV blocking layer 50 can block UV light that is not absorbed by the color conversion layers 40. The UV blocking layer 50 can be a Bragg reflector, or can simply be a material that is selectively absorptive to UV light (e.g., a benzotriazolyl hydroxyphenyl compound). A Bragg reflector can reflect UV light back toward the micro-LEDs 14, thus increasing energy efficiency. Other layers, such as straylight absorbing layers, photoluminescent layers, and high refractive index layers include materials may also be optionally deposited on micro-LEDs 14.

Thus, as described herein, a photocurable composition includes color conversion agents (CCAs) selected to emit radiation in a first wavelength band in the visible light range in response to absorption of radiation in a second wavelength band in the UV or visible light range, a reactive component (e.g., one or more monomers), and a photo-initiator that initiates polymerization of the active component in response to absorption of radiation in the second wavelength band. The second wavelength band is different than the first wavelength band.

In some embodiments, a light-emitting device includes a plurality of light-emitting diodes, and a cured composition in contact with a surface through which radiation in a first wavelength band in the UV or visible light range is emitted from each of the light-emitting diodes. The cured composition includes a nanomaterial selected to emit radiation in a second wavelength band in the visible light range in response to absorption of radiation in the first wavelength band from each of the light-emitting diodes, a photopolymer, and components (e.g., fragments) of a photo-initiator that initiates polymerization of the photopolymer in response to absorption of radiation in the first wavelength band. The second wavelength band is different than the first wavelength band.

In some embodiments, a light-emitting device includes an additional plurality of light-emitting diodes and an additional cured composition in contact with a surface through which radiation in the first wavelength band is emitted from each of the additional light-emitting diodes. The additional cured composition includes an additional color conversion agent (CCA) selected to emit radiation in a third wavelength band in the visible light range in response to absorption of radiation in the first wavelength band from each of the light-emitting diodes, an additional photopolymer, and components of an additional photo-initiator that initiates polymerization of the photopolymer in response to absorption of radiation in the first wavelength band. The third wavelength band can be different than the second wavelength band.

Figure 4A:
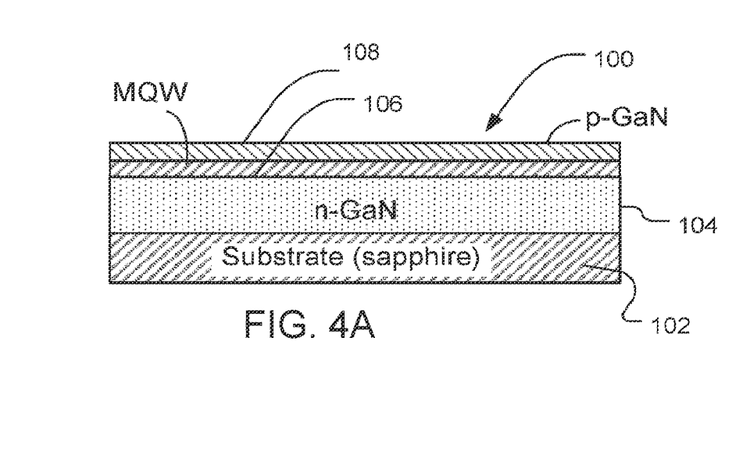
FIGS. 4A-4E illustrate a method of fabricating a micro-LED array and isolation walls on a backplane in accordance with one or more embodiments.

FIGS. 4A-4E illustrate a method of fabricating a micro-LED array and isolation walls on a backplane. Referring to FIG. 4A, the process starts with the wafer 100 that will provide the micro-LED array. The wafer 100 includes a substrate 102, e.g., a silicon or a sapphire wafer, on which are disposed a first semiconductor layer 104 having a first dopant, an active layer 106, and a second semiconductor layer 108 having a second dopant. For example, the first semiconductor layer 104 can be an n-doped gallium nitride (n-GaN) layer, the active layer 106 can be a multiple quantum well (MQW) layer 106, and the second semiconductor layer 108 can be a p-doped gallium nitride (p-GaN) layer.

Figure 4B:
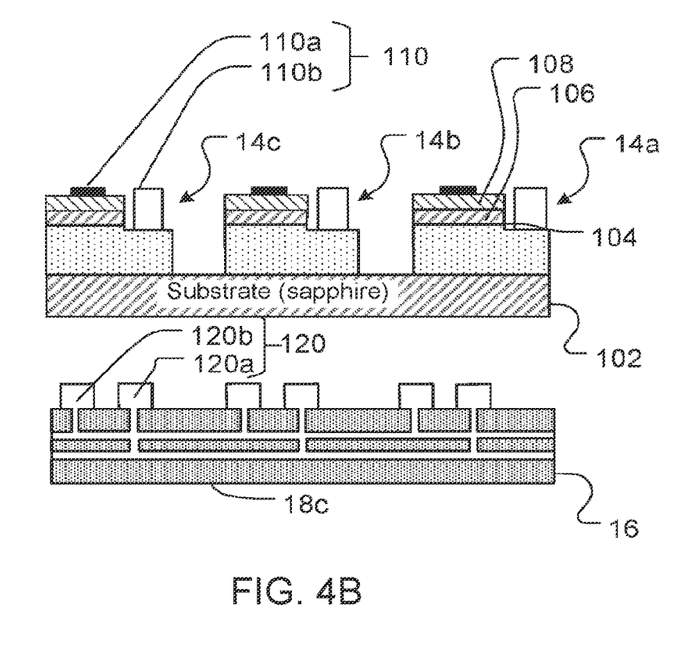

Referring to FIG. 4B, the wafer 100 is etched to divide the layers 104, 106, 108 into individual micro-LEDs 14, including the first, second, and third plurality of micro-LEDs 14a, 14b, 14c that correspond to the first, second, and third colors. In addition, conductive contacts 110 can be deposited. For example, a p-contact 110a and an n-contact 110b can be deposited onto the first semiconductor layer 104 (e.g., the n-GaN layer) and the second semiconductor layer 108 (e.g., the p-GaN layer), respectively.

Similarly, the backplane 16 is fabricated to include the backplane circuitry 18, as well as electrical contacts 120. The electrical contacts 120 can include first contacts 120a, e.g., drive contacts, and second contacts 120b, e.g., ground contacts.

Figure 4C:
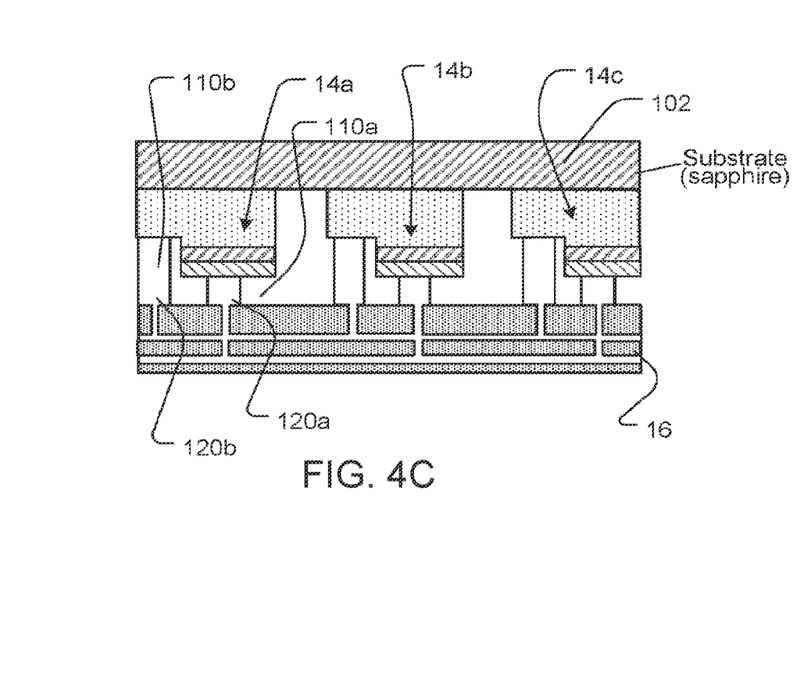

Referring to FIG. 4C, the micro-LED wafer 100 is aligned and placed in contact with the backplane 16. For example, the p-contact 110a can contact the first contacts 120a, and the n-contact 110b can contact the second contacts 120b. The micro-LED wafer 100 could be lowered into contact with the backplane, or vice-versa.

Figure 4D:
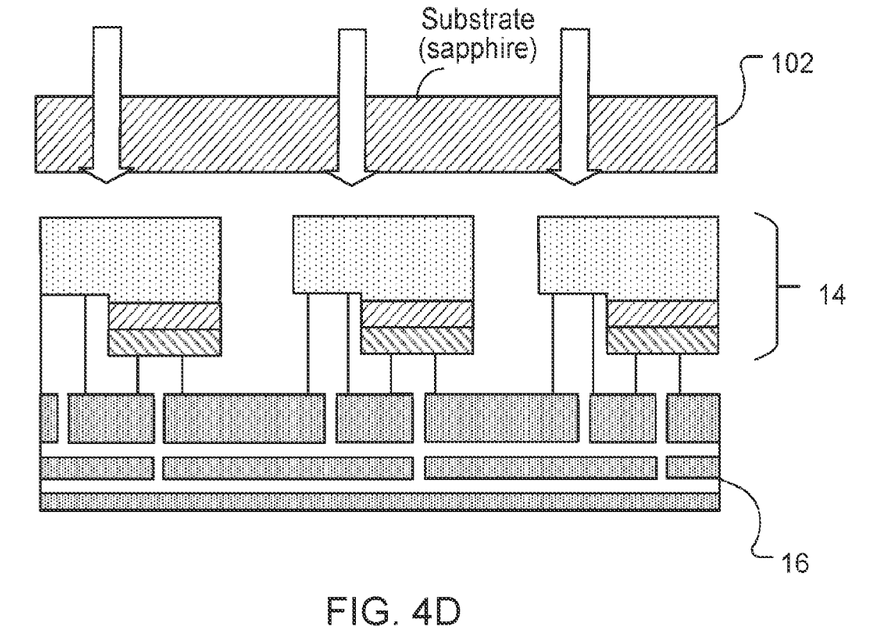

Next, referring to FIG. 4D, the substrate 102 is removed. For example, a silicon substrate can be removed by polishing away the substrate 102, e.g., by chemical mechanical polishing (CMP). As another example, a sapphire substrate can be removed by a laser liftoff process.

Figure 4E:
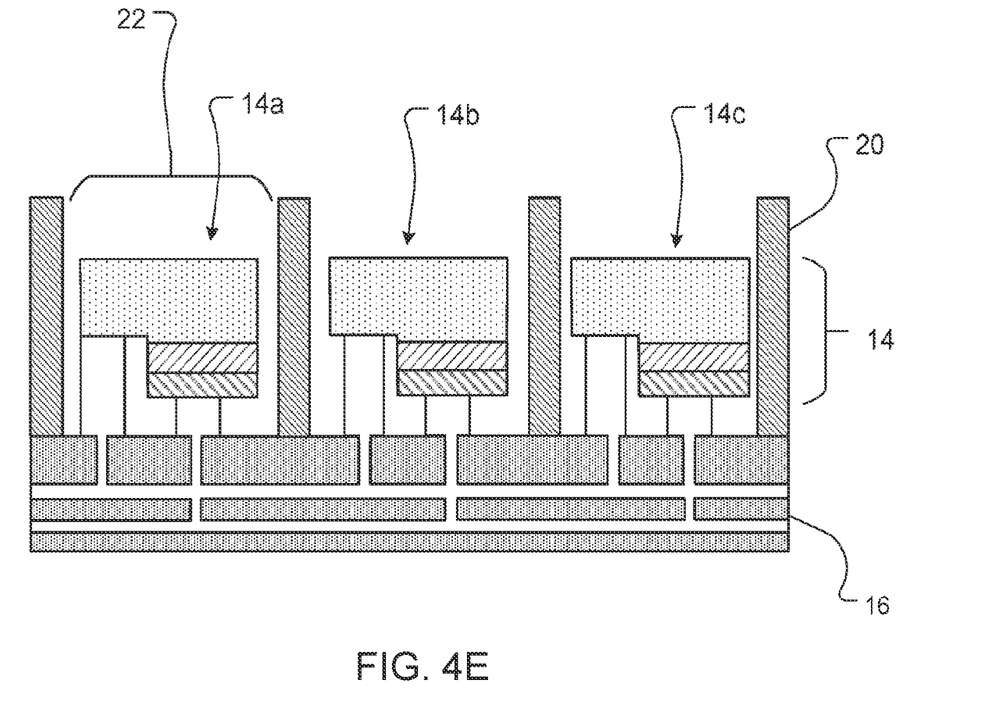

Finally, referring to FIG. 4E, the vertical isolation walls 20 are formed on the backplane 16 (to which the micro-LEDs 14 are already attached). The vertical isolation walls 20 can be formed by a conventional process such as deposition of photoresist, patterning of the photoresist by photolithography, and development to remove the portions of the photoresist corresponding to the recesses 22. The resulting structure can then be used as the micro-LED display 10 for the processes described for FIGS. 3A-3H.

FIGS. 5A-5D illustrate another method of fabricating a micro-LED array and isolation walls on a backplane. The process described with respect to FIGS. 5A-5D can be similar to the process discussed above with respect to FIGS. 4A-4E, except as noted below.

Figure 5A:
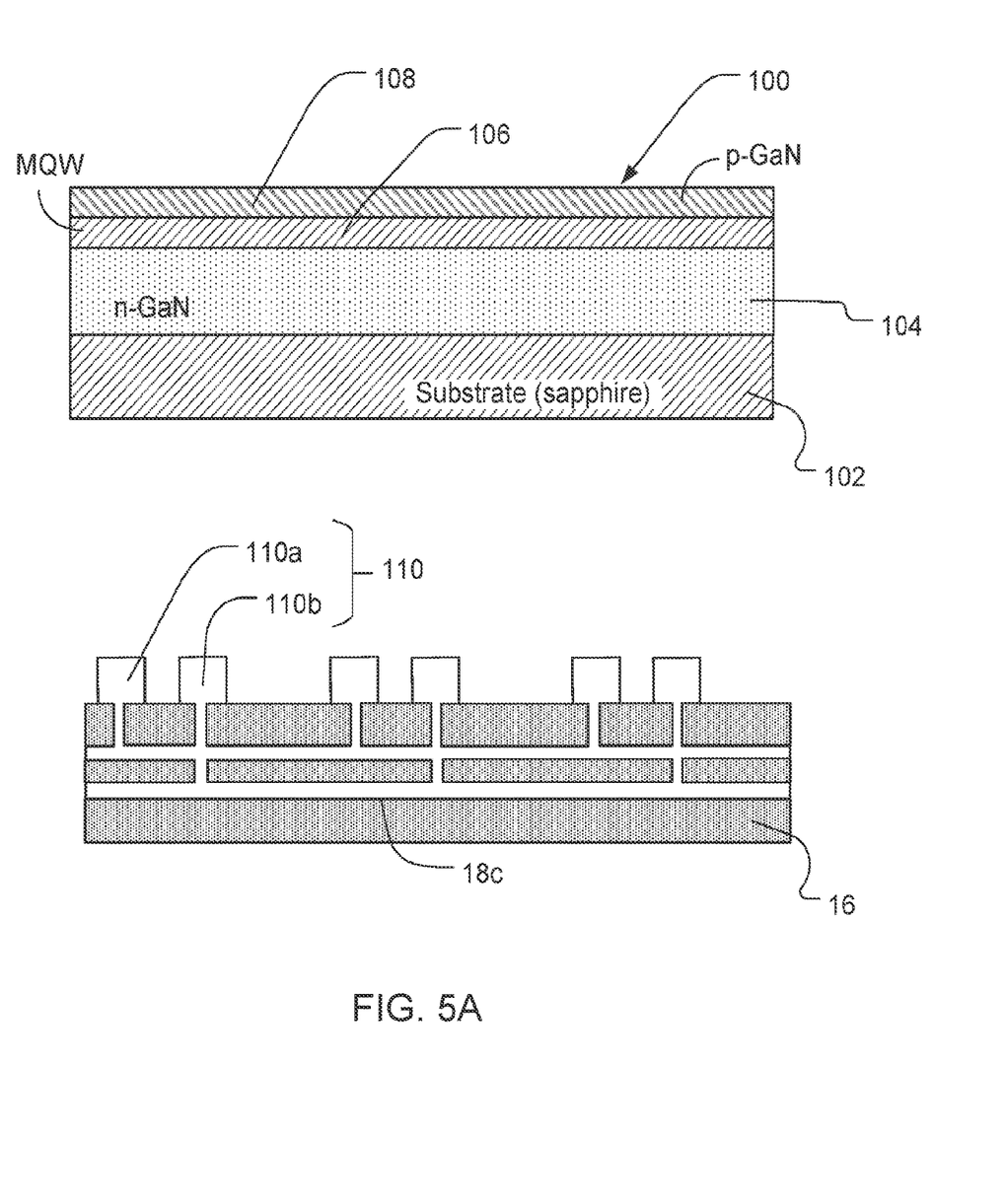
FIGS. 5A-5D illustrate another method of fabricating a micro-LED array and isolation walls on a backplane in accordance with one or more embodiments.
Figure 5B:
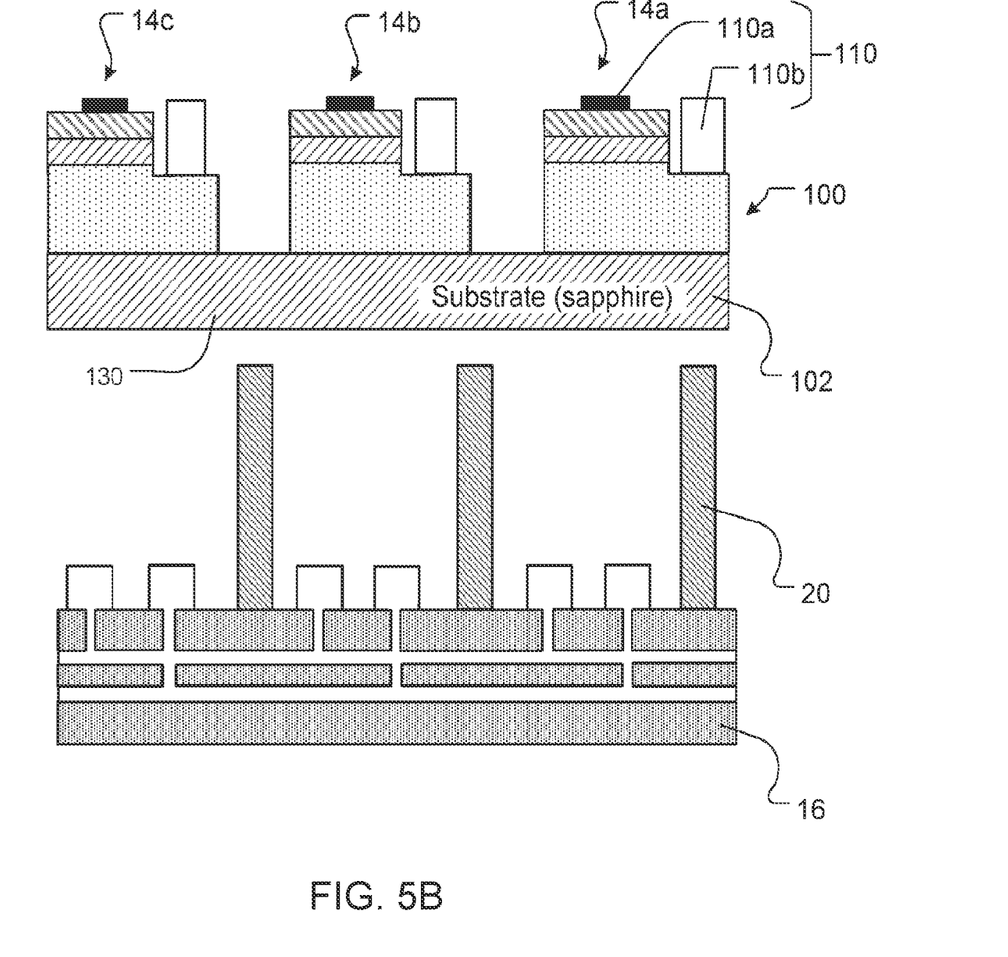

Referring to FIG. 5A, the process starts similarly to the process described above with respect to FIGS. 4A-4E, with the wafer 100 that will provide the micro-LED array and the backplane 16. Referring to FIG. 5B, the vertical isolation walls 20 are formed on the backplane 16 (to which the micro-LEDs 14 are not yet attached). In addition, the wafer 100 is etched to divide the layers 104, 106, 108 into individual micro-LEDs 14, including the first, second and third plurality of micro-LEDs 14a, 14b, 14c. The recesses 130 formed by this etching process are sufficiently deep to accommodate the vertical isolation walls 20. For example, the etching can continue so that the recesses 130 extend into the substrate 102.

Figure 5C:
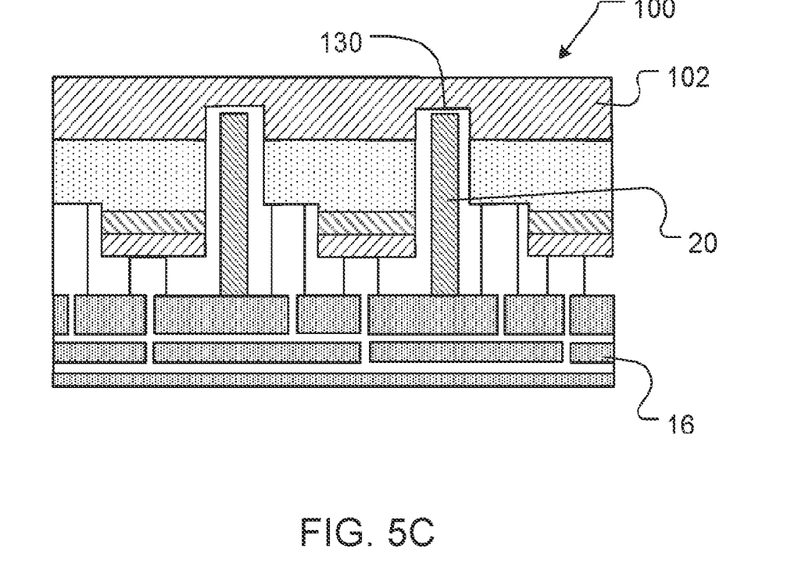

Next, as shown in FIG. 5C, the micro-LED wafer 100 is aligned and placed in contact with the backplane 16 (or vice-versa). The vertical isolation walls 20 fit into the recesses 130. In addition, the conductive contacts 110, e.g., the p-contact 110a and the n-contact 110b, of the micro-LEDs are electrically connected to the electrical contacts 120 of the backplane 16.

Figure 5D:
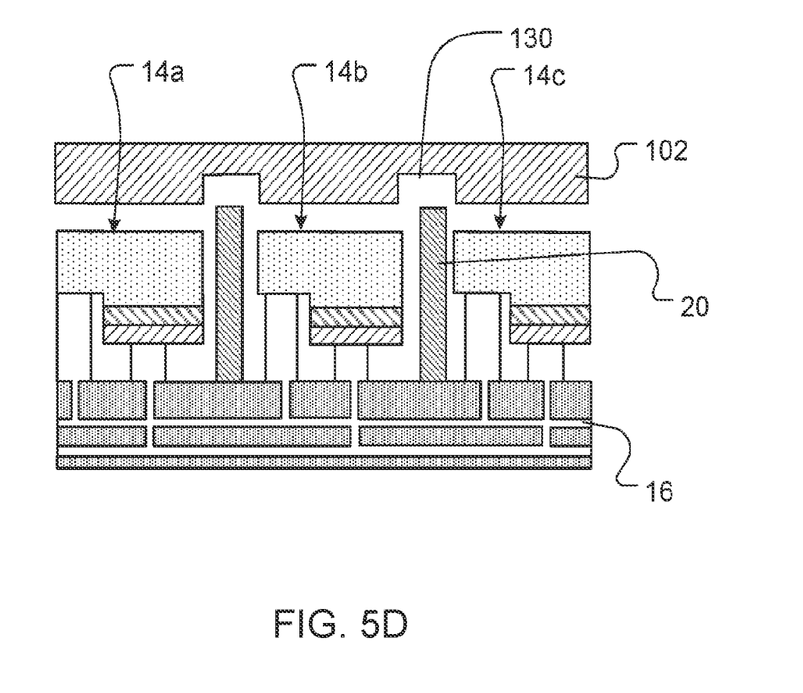

Finally, referring to FIG. 5D, the substrate 102 is removed. This leaves the micro-LEDs 14 and the vertical isolation walls 20 on the backplane 16. The resulting structure can then be used as the micro-LED display 10 for the processes described with reference to FIGS. 3A-3H.

Terms of positioning, such as vertical and lateral, have been used in the present disclosure. However, it should be understood that such terms refer to relative positioning, not absolute positioning with respect to gravity. For example, laterally is a direction parallel to a substrate surface, whereas vertically is a direction normal to the substrate surface.

It will be appreciated to those skilled in the art that the preceding embodiments are exemplary and not limiting. For example, although the above description focuses on micro-LEDs, the techniques can be applied to other displays with other types of light emitting diodes, particularly displays with other micro-scale light emitting diodes, e.g., LEDs less than about 10 microns across.

Although the above description assumes that the order in which the color conversion layers are formed is blue, then green, then red, other orders are possible, e.g., blue, then red, then green. In addition, other colors are possible, e.g., orange and yellow.

The disclosure is now described with reference to the following Example.

Inventive Example 1

A liquid dispersion of quantum dot particles was prepared. The liquid dispersion included a red ink formulation, a green ink formulation, and a blue ink formulation. Each of the red ink formulation, the green ink formulation, and the blue ink formulation independently include an acrylic medium having a boiling point in a range of from greater than or equal to 100° C. to less than or equal to 500° C., where the respective red, green, and blue quantum dot particles are dispersed in the acrylic medium, a photoinitiator, and a surface additive.

The red ink formulation includes 55.50 weight % red quantum dot particles (including 35 weight % inorganic part) in 1,6-hexanediol diacrylate (HDDA), 40.55 weight % diethyl acrylamide (DEAA), 3.85 weight % ethyl(2,4,6-trimethylbenzoyl)phenylphosphinate (TPO-L), and 0.10 weight % BYK-307. In some experiments, the red quantum dot particles included in a range of from 15 inorganic weight % to 25 inorganic weight % in the red ink formulation by adjusting the amount of the red quantum dot particles in HDDA at the expense of DEAA. In some experiments, the red quantum dot particles included in a range of from 15 inorganic weight % to 25 inorganic weight %, in the range of from 16 inorganic weight % to 24 inorganic weight %, in the range of from 17 inorganic weight % to 23 inorganic weight %, in the range of from 18 inorganic weight % to 22 inorganic weight %, in the range of from 19 inorganic weight % to 21 inorganic weight %, in the range of from 20 inorganic weight % to 25 inorganic weight %, in the range of from 15 inorganic weight % to 22 inorganic weight %, in the range of from 15 inorganic weight % to 20 inorganic weight %, or in the range of from 17 inorganic weight % to 20 inorganic weight % in the red ink formulation by adjusting the amount of the red quantum dot particles in HDDA at the expense of DEAA.

The green ink formulation includes 71.50 weight % green quantum dot particles (including 35 weight % inorganic part) in HDDA, 24.55 weight % HDDA, 3.85 weight % TPO-L, and 0.10 weight % BYK-307. In some experiments, the green quantum dot particles included in a range of from 20 inorganic weight % to 33 inorganic weight % in the green ink formulation by adjusting the amount of the green quantum dot particles in HDDA at the expense of HDDA. In some experiments, the green quantum dot particles included in a range of from 20 inorganic weight % to 33 inorganic weight %, in the range of from 21 inorganic weight % to 32 inorganic weight %, in the range of from 21 inorganic weight % to 32 inorganic weight %, in the range of from 22 inorganic weight % to 31 inorganic weight %, in the range of from 23 inorganic weight % to 30 inorganic weight %, in the range of from 24 inorganic weight % to 29 inorganic weight %, in the range of from 25 inorganic weight % to 28 inorganic weight %, in the range of from 20 inorganic weight % to 30 inorganic weight %, or in the range of from 22 inorganic weight % to 28 inorganic weight % in the green ink formulation by adjusting the amount of the green quantum dot particles in HDDA at the expense of HDDA.

The blue ink formulation includes 96.05 weight % blue quantum dot particles (including 40 weight % inorganic part) in HDDA, 3.85 weight % TPO-L, and 0.10 weight % BYK-307. In some experiments, the blue quantum dot particles included in a range of from 20 inorganic weight % to 40 inorganic weight % in the blue ink formulation by diluting the blue quantum dot particles in HDDA with HDDA. In some experiments, the blue quantum dot particles included in a range of from 20 inorganic weight % to 40 inorganic weight %, in the range of from 22 inorganic weight % to 40 inorganic weight %, in the range of from 25 inorganic weight % to 40 inorganic weight %, in the range of from 30 inorganic weight % to 40 inorganic weight %, in the range of from 32 inorganic weight % to 40 inorganic weight %, or in the range of from 35 inorganic weight % to 40 inorganic weight %.

Advantageously, the liquid dispersion including the red ink formulation, the green ink formulation, and the blue ink formulation has suitable properties for spin coating, ink-jet printing, and UV curing. The liquid dispersion including the red ink formulation, the green ink formulation, and the blue ink formulation is useful as stable liquid formulations that resist gelling for spin-coating and ink-jet printing. Each of the red ink formulation, the green ink formulation, and the blue ink formulation advantageously have suitable density, viscosity (in a range of from 5 to 30 centipoise (cP) at room temperature, e.g., a temperature in a range of from 20° C. to 25° C.), and surface tension (in a range of from 20 to 25 dynes per centimeter (dyne/cm)) for ink-jet printing, can be UV cured efficiently using 385 nm, and have superior optical properties for applications as a color conversion layer in advanced displays. Advantageously, after UV curing, each of the red ink formulation, the green ink formulation, and the blue ink formulation remain transparent and are highly stable to the 385 nm UV light.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A liquid dispersion of quantum dot particles comprising:

an acrylic medium having a boiling point in a range of from greater than or equal to 100° C. to less than or equal to 500° C., the acrylic medium comprising one or more of an acrylate monomer or an acrylamide monomer, the quantum dot particles dispersed in the acrylic medium;

a photo-initiator; and a surface additive, wherein the liquid dispersion of quantum dot particles comprises one or more of a red ink formulation, a green ink formulation, or a blue ink formulation, the red ink formulation including in a range of from 42 weight % to 73 weight % red quantum dot particles in 1,6-hexanediol diacrylate (HDDA), in a range of from 24 weight % to 54 weight % diethyl acrylamide (DEAA), in a range of from 2 weight % to 5 weight % photo-initiator, and in a range of from 0 weight % to 0.50 weight % surface additive, and wherein the liquid dispersion of quantum dot particles comprises in a range of from 15 inorganic weight % to 25 inorganic weight % red quantum dot particles in the red ink formulation.

2. The liquid dispersion of quantum dot particles according to claim 1, wherein the boiling point of the acrylic medium is in a range of from 180° C. to less than or equal to 500° C.

3. The liquid dispersion of quantum dot particles according to claim 2, wherein the boiling point of the acrylic medium is in a range of from 180° C. to 250° C.

4. The liquid dispersion of quantum dot particles according to claim 1, wherein the photo-initiator comprises one or more of diphenyl(2,4,6-trimethylbenzoyl)-phosphine oxide (TPO) or ethyl(2,4,6-trimethylbenzoyl)phenylphosphinate (TPO-L).

5. The liquid dispersion of quantum dot particles according to claim 1, wherein the surface additive comprises a polyether-modified polydimethylsiloxane.

6. The liquid dispersion of quantum dot particles according to claim 1, further comprising the green ink formulation, wherein the green ink formulation comprises in a range of from 57 weight % to 94 weight % green quantum dot particles in HDDA, in a range of from 2 weight % to 40 weight % HDDA, in a range of from 2 weight % to 5 weight % photo-initiator, and in a range of from 0 weight % to 0.50 weight % of a polyether-modified polydimethylsiloxane.

7. The liquid dispersion of quantum dot particles according to claim 6, comprising in a range of from 20 inorganic weight % to 33 inorganic weight % green quantum dot particles in the green ink formulation.

8. The liquid dispersion of quantum dot particles according to claim 1, further comprising the blue ink formulation, wherein the blue ink formulation comprises in a range of from 50 weight % to 98 weight % blue quantum dot particles in HDDA, in a range of from 2 weight % to 5 weight % photo-initiator, and in a range of from 0 weight % to 0.50 weight % of a polyether-modified polydimethylsiloxane.

9. The liquid dispersion of quantum dot particles according to claim 8, comprising in a range of from 20 inorganic weight % to 40 inorganic weight % blue quantum dot particles in the blue ink formulation.

10. The liquid dispersion of quantum dot particles according to claim 1, having a viscosity in a range of from 5 to 30 centipoise (cP) at a temperature in a range of from 20° C. to 25° C.

11. The liquid dispersion of quantum dot particles according to claim 1, having a surface tension in a range of from 20 to 25 dynes per centimeter (dyne/cm).

12. A liquid dispersion of quantum dot particles comprising:
- an acrylic medium having a boiling point in a range of from greater than or equal to 100° C. to less than or equal to 500° C., the acrylic medium comprising one or more of an acrylate monomer, a diacrylate monomer, or an acrylamide monomer, the quantum dot particles dispersed in the acrylic medium;
- a photo-initiator;
- a surface additive; and
- at least one additional acrylic monomer, the at least one additional acrylic monomer comprising diethyl acrylamide (DEAA), isobornyl acrylate (IBOA), 1,4-butanediol diacrylate (BDA), nonanediol diacrylate (NDDA), trimethylolpropane triacrylate (TMPTA), or a mixture thereof.

13. The liquid dispersion of quantum dot particles according to claim 12, wherein the acrylic medium has the same composition as the at least one additional acrylic monomer.

14. The liquid dispersion of quantum dot particles according to claim 12, wherein the acrylic medium comprises 1,6-hexanediol diacrylate (HDDA).

\* \* \* \* \*